(12) United States Patent
Bezama et al.

(10) Patent No.: US 6,330,157 B1
(45) Date of Patent: Dec. 11, 2001

(54) VARIABLE THERMAL EXCHANGER AND METHOD THEREOF

(75) Inventors: Raschid J. Bezama, Mahopac, NY (US); Raed A. Sherif, Woodland Hills, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,158

(22) Filed: Dec. 21, 1999

(51) Int. Cl.$^7$ ...................................................... H05K 7/20
(52) U.S. Cl. ............................ 361/704; 361/689; 361/690; 361/699; 361/703; 361/718; 361/719; 257/714; 257/721; 257/722; 165/80.3; 165/185; 174/16.1; 174/16.3
(58) Field of Search ...................................... 361/687, 690, 361/694, 695, 697, 702, 704, 722, 717–719, 699, 700; 454/184; 257/706, 713, 714, 722; 174/16.3; 165/80.3, 185, 121–126

(56) References Cited

U.S. PATENT DOCUMENTS

| | | | |
|---|---|---|---|
| 4,081,825 | * | 3/1978 | Koopman et al. ................... 257/713 |
| 4,109,707 | * | 8/1978 | Wilson et al. ....................... 361/699 |
| 4,441,653 | | 4/1984 | Grudich . |
| 4,460,121 | | 7/1984 | Hedrick . |
| 4,795,997 | * | 1/1989 | Fisher et al. ........................ 337/380 |
| 5,107,330 | * | 4/1992 | Dahringer ........................... 257/718 |
| 5,186,385 | | 2/1993 | Karabin et al. . |
| 5,471,844 | * | 12/1995 | Levi ..................................... 62/51.1 |
| 5,491,610 | | 2/1996 | Mok et al. . |
| 5,773,755 | * | 6/1998 | Iwatare ................................ 361/695 |
| 5,870,014 | | 2/1999 | Nield, Jr. et al. . |
| 5,875,096 | * | 2/1999 | Gates ................................... 361/704 |
| 6,016,250 | * | 1/2000 | Hanners .............................. 361/695 |

FOREIGN PATENT DOCUMENTS 2 184 291 * 6/1987 (GB) ............................ H01L/23/54

* cited by examiner

Primary Examiner—Leo P. Picard
Assistant Examiner—Boris L. Chervinsky
(74) Attorney, Agent, or Firm—Aziz M. Ahsan; Jay H. Anderson

(57) ABSTRACT

This invention relates to an apparatus or device for exchanging heat from electronic components or heat sinks, and method thereof. More particularly, this invention is directed to heat sinks which incorporates an innovative thermo-mechanically actuated device which modulates the capability of the heat sink to dissipate heat, and method thereof.

8 Claims, 2 Drawing Sheets

VARIABLE THERMAL EXCHANGER AND METHOD THEREOF

FIELD OF THE INVENTION

This invention relates to an apparatus or device for exchanging heat from electronic components or heat sinks, and method thereof. More particularly, this invention is directed to heat sinks which incorporate an innovative thermo-mechanically actuated device which modulates the capability of the heat sink to dissipate heat, and method thereof.

BACKGROUND OF THE INVENTION

Continuous improvements in the technology used to manufacture integrated circuits has lead to the development of silicon chips with increasingly larger number of discrete components which operate at faster and faster speeds. As the number of components and the operating speed increases, the power needed to operate such chips also increases. To prevent chip overheating and consequent change in the discrete components operating characteristics, the chip power consumption must be promptly dissipated into the environment. In addition, the chip must be interconnected electrically to other components to provide its designed function. Both the electrical inter-connectivity and thermal dissipation functions are provided by mounting the given chip in an assembly which may include a heat sink. The assembly must be selected carefully because its thermal characteristics directly determine the system reliability.

Depending on the power dissipation level required by the chip, several cooling techniques may be used to aid the heat dissipation process. When the total power consumption is low, for example, below about 3 watts per chip, a simple flat plate heat sink, and low velocity air convection or even natural convection is sufficient to adequately cool the chip below its maximum allowed operating temperature, typically known as maximum junction temperature. As the power dissipation increases, the complexity of the cooling techniques used also increases. Very high power dissipation, for example, above about 50 watts per chip, require the use of advanced cooling technologies, such as, found in the use of heat sinks with integrated heat pipes, and/or the use of solder to thermally couple the chip to the heat sink. In between these two extreme situations, the use of conventional finned heat sinks and an adequate level of air forced convection typically provides the desired cooling capability.

The operating thermal characteristic of a chip using a conventional cooling technology is relatively simple; however, it is difficult to determine a given chip operating temperature. The chip operating temperature relative to the cooling fluid temperature is proportional to the chip power dissipation. The proportionality constant is a function of the assembly thermal characteristics and represents the assembly thermal resistance, typically measured in ° C./Watt. Chip assemblies using conventional heat sinks have constant thermal resistance mainly because for most applications it is not practical to change the cooling fluid velocity. Here, the global fluid velocity must be kept constant because the same fluid flow stream is also used to cool other devices not part of the given assembly. Thus, with the use of conventional heat sinks, it is difficult to estimate the final operating temperature of a chip because the fluid velocity and temperature around the assembly are not well defined until the thermal characteristics of all devices located upstream and downstream are well defined and the flow distribution in the system is well established.

When the system includes a single device sensitive to its operating temperature, active control is possible. An example of this particular situation is described in U.S. Pat. No. 5,491,610 (Mok et al.), assigned to International Business Machines Corporation, Armonk, USA, and the disclosure of which is incorporated herein by reference, where active means are provided to control the temperature gradient in a particular location of the assembly using temperature sensing and controller circuits.

An assembly thermal resistance typically includes the chip thermal resistance, heat sink thermal resistance, and heat-sink to fluid thermal resistance. In most air cooled applications, the last thermal resistance is much larger than the other two resistances because of poor air thermal conductivity relative to the thermal conductivity of the other components. In this case, the assembly thermal resistance becomes direct function of the inverse of the product between the heat sink area and the convective heat transfer coefficient. In applications which use liquids to cool the electronic assemblies, the thermal resistance in the fluid phase is much lower than the fluid thermal resistance of assemblies using air cooling. Here, the devices operating temperature become very sensitive to the fluid velocity and temperature distribution and the system local power distribution. In both cases, chip performance is not well known until the whole system is assembled and tested, and it is again difficult to know in advance the final operating temperature of the chips and other electrical devices in a system even on liquid cooled applications.

A similar but more complex thermal problem arises when conventional cooling devices are used to cool large chips with significant differences in power density dissipation over the chip area. For example, advanced devices which include both system logic and large cache memory on one chip belong to this group. Here, a large chip is needed to provide sufficient area for both electric functions; however, the power dissipation density from the small part of the chip used to built the system logic is easily an order of magnitude larger than the power dissipation density of the rest of the chip which has the memory function. To equalize the power dissipation into the heat sink, this type of chip requires the use of a large heat spreader which add significant weight to the assembly, and introduce significant challenges to the system reliability and thermal design engineering needed to build the needed assembly.

The use of a conventional heat sink to cool a chip also introduces an additional thermal problem when the chip of interest includes power management capability.

Here, the chip power consumption changes on demand and increases to its maximum design power consumption level when the chip is fully functional or reduces to a low power consumption level when the device is on a stand-by mode. Power management is used mainly to conserve energy on portable electronic appliances of all kinds, or on environmentally friendly systems, or on systems where the maximum power available is constrained. The power management capability introduces additional thermal cycles to the assembly which can become a significant addition to the total number of thermal cycles experienced by the assembly when determining its reliability level. Stand-by power levels are typically about an order of magnitude lower than the fully operational power consumption level. Furthermore, the operating temperature of a chip relative to the fluid temperature varies linearly with the chip power usage when using conventional cooling methods. Thus, when on standby, such assemblies will power down and change the device operating temperature to a level closer to the cooling fluid temperature. The consequent change in temperature between full power and stand-by power is then in the same range as the change in temperature between full power and when the device is power-off. Therefore, the assembly total number of thermal cycles must include both the traditional power-on/power-off cycles and the power management induced number of stand-by cycles in each power-on/power-off cycle.

Thus, the consequent increase in the total number of thermal cycles could significantly shorten the product life due to the assembly interconnection reliability limitations. The selection of thermal cooling technology also determines the thermal transient response of a given chip and can be an important design factor when the devices must reach operating temperature in a short time. Thermal transients are significantly larger than electrical transients, for example, easily by six orders of magnitude or more; but discrete components electrical characteristics are very sensitive to operating temperature. Therefore, all electronic devices after power-on need to wait a relatively large warm-up time before being capable to operate in a reliable mode. The assembly thermal transient increases with the assembly thermal mass. Since at a given time during the assembly warm-up time the assembly heat-up rate is proportional to the difference between the chip power dissipation and the heat sink cooling capability, the thermal transient time increases when the heat sink used has large cooling capability. Conventional heat sinks are typically selected to be capable of dissipating the maximum operating power of the given chip, thus, the assembly thermal transient response is inherently maximized.

While conventional heat sinks provide an effective method to cool heat dissipating assemblies, they also introduce many difficulties as known in the art which can contribute to short mean-time-between-failure (MTBF) of critical components, or unacceptable long warm-up times on time-critical devices. These and other difficulties can be caused by the thermal characteristics of conventional heat sinks. The thermal resistance of the heat sink of the prior art is considered relatively constant because no attempt has been made to change the air velocity circulating through the heat sink. In most systems, the air velocity is constant and not well known until the system is assembled and fully functional. Both air velocity and temperature distribution are fully dependent on all the system devices upstream and downstream from the assembly of interest, hence its determination from design data presents a very complex thermal design problem. In spite of this inherent complexity, the thermal characteristic response of such a conventional heat sink is relatively simple and operates typically in a linear or straight line fashion. Thus the device of the prior art will increase its operating temperature relative to the fluid temperature proportionally to the power dissipated by the given device.

It would be desirable then to have a heat sink which overcomes all the thermal problems stated above which are created by the use of conventional heat sinks with relatively constant thermal resistance.

PURPOSES AND SUMMARY OF THE INVENTION

The invention is a novel method and apparatus for providing a thermal device with variable thermal exchange capability.

Therefore, one purpose of this invention is to provide a heat sink which reduces the thermal cycle fatigue of assemblies with variable power dissipation.

Another purpose of this invention is to provide a heat sink which reduces the sensitivity between the heat dissipating device operating temperature and its maximum power dissipation.

Yet another purpose of this invention is to provide a heat sink which reduces the warm-up time during assembly power-on process.

Still another purpose of this invention is to provide a heat sink device with cooling rate which has low sensitivity to variations on fluid temperature distribution.

Still yet another purpose of this invention is to provide a heat sink which reduces the variation of operating temperature on systems with multiple heat dissipating devices.

A further purpose of this invention is to provide a heat sink which simplifies the effort of selecting a heat sink for an heat dissipating assembly during the design phase.

Yet another purpose of this invention is to provide variable cooling to at least one electronic device, such as, for example, a capacitor, a circuit chip, to name a few.

Therefore, in one aspect this invention comprises a variable thermal exchanger comprising a base and at least one variable thermal component secured thereto.

In another aspect this invention comprises an apparatus for cooling a heat dissipating assembly using fluid flow comprising:
 (a) at least one heat dissipating device;
 (b) at least one heat sink thermally attached to said at least one heat dissipating device; and
 (c) at least one thermo-mechanically activated fluid flow control device on said heat sink with mechanical means to modulate local fluid movement in said heat sink.

In yet another aspect this invention comprises an apparatus for heating or cooling an assembly using at least one fluid comprising:
 (a) at least one assembly to be heated or cooled; and
 (b) at least one thermo-mechanically activated fluid flow control device thermally coupled to said at least one assembly, and with mechanical means to modulate said local fluid velocity over said assembly.

In still another aspect this invention comprises an apparatus for cooling a heat dissipating assembly using cooling fluid flow comprising:
 (a) at least one heat dissipating device;
 (b) at least one cold plate, with internal channels to circulate said cooling fluid, and thermally coupled to said at least one heat dissipating device; and
 (c) at least one thermo-mechanically activated flow control device inside said at least one cold plate with at least one mechanical means to modulate said local fluid movement over said cold plate.

In still yet another aspect this invention comprises an apparatus for cooling a heat dissipating assembly using at least one cooling fluid comprising:
 (a) at least one heat dissipating device; and
 (b) at least one thermo-mechanically activated device, thermally coupled to said at least one heat dissipating device, and with means to modulate heat exchange over said at least one heat dissipating device.

In yet another aspect this invention comprises a process for thermal exchange, comprising at least one heat sink with at least one variable heat exchange component secured thereto, and wherein said heat exchange component transfers heat at variable rate in response to a thermal change.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
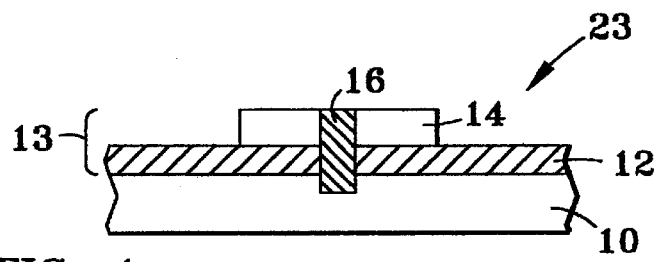
FIG. 1, is a cross-sectional view illustrating a preferred embodiment of the invention, with the inventive flaps in a minimum separation position from the heat sink.

FIG. 1, is a cross-sectional view illustrating a preferred embodiment of a variable thermal exchanger or flow control device or variable cooling heat sink 23, of this invention, with at least one variable thermal component 13, in a minimum separation position from heat sink or spreader 10. The variable thermal component 13, is preferably secured to the heat sink 10, by at least one securing device 16. It is preferred that the variable thermal component 13, is preferably secured to the heat sink 10, by the securing device 16, in the center, so as to allow movement at each end of the variable thermal component 13. It is also preferred that the variable thermal component 13, further comprises of at least one flap, such as, a first flap 12, a second flap 14, and so on.

For some applications the thermal coefficient of expansion (TCE) of the first flap 12, could be the same as the TCE for the second flap 14. However, for some other applications the TCE for the first flap 12, could be different than the TCE for the second flap 14. Similarly, for some applications the physical dimension of the first flap 12, could be the same as that for the second flap 14. However, for some other applications the physical dimension of the first flap 12, could be different than that for the second flap 14.

Material for the heat sink or spreader 10, is typically selected from a group comprising aluminum, aluminum nitride, copper, copper-tungsten composites, silicon carbide, thermally conductive polymers, to name a few.

Material for the variable thermal component 13, is typically selected from a group comprising aluminum, steel, copper, brass, nickel, iron, polymers, metal composites, to name a few.

The securing device 16, is typically selected from a group comprising nail, screw, rivet, adhesive, to name a few, or it can be made as an integral part of the flap 12 and/or 14.

In a preferred embodiment of the present invention, the flow control device 23, comprises of at least two plates or flaps 12 and 14, with different thermal coefficient of expansion or TCE, and joined over one surface to form a bimetallic strip 13, in the manner shown in FIG. 1. It should be noted that the term "bimetallic strip" is used even when one or more materials forming the strip are not metal, or when more than two materials are used.

Figure 2:
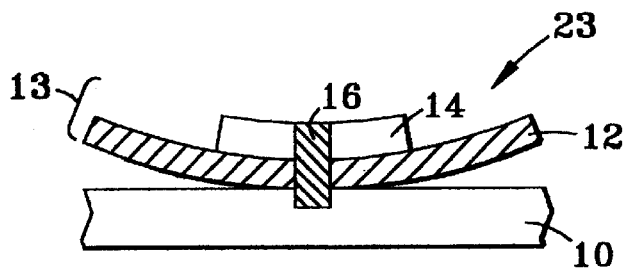
FIG. 2, is a cross-sectional view illustrating a preferred embodiment of the invention, with the inventive flaps in an intermediate separation position from the heat sink.

FIG. 2, is a cross-sectional view illustrating a preferred embodiment of the invention, with the inventive flaps 12 and 14, of the variable cooling component 13, in an intermediate separation position from the heat sink 10.

Figure 3:
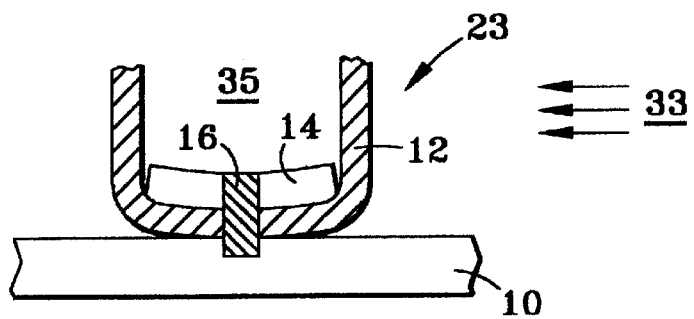
FIG. 3, is a cross-sectional view illustrating a preferred embodiment of the invention, with the inventive flaps in a maximum separation position from the heat sink.

FIG. 3, is a cross-sectional view illustrating a preferred embodiment of the invention, with the inventive flaps 12 and 14., of the variable cooling heat sink 23, in a maximum separation position from the heat sink 10. In this maximum separation position the flaps 12 and/or 14, would be able to stop or divert any fluid 33, and/or channel any fluid flow 35. This diverting and/or channeling of the fluid flow 33 and/or 35, will of course depend upon the other environmental constraints in the vicinity.

Figure 4:
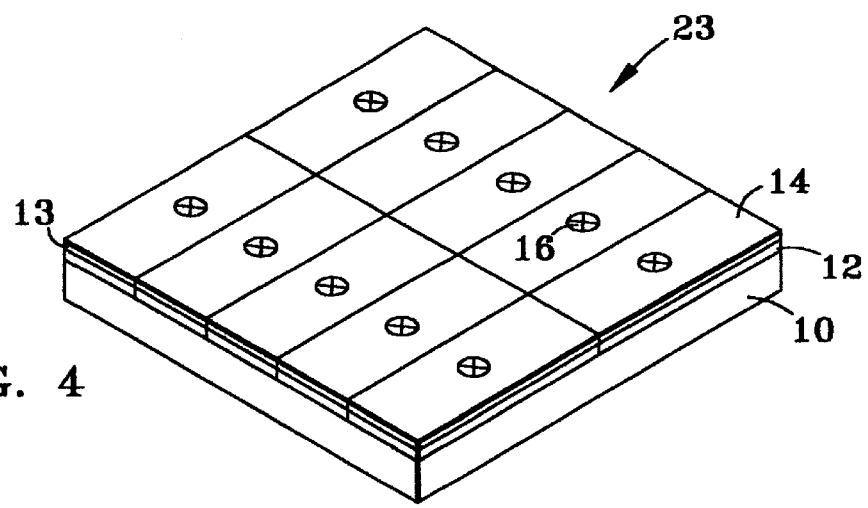
FIG. 4, is an isometric view illustrating an alternative embodiment of the invention.

An alternative use of the flow control device 23, on heat sinks can also be advantageous when cooling heat dissipating devices with natural convention. Since natural convection cooling does not uses forced flow of a fluid to provide the required cooling capability, the action of a thermo-mechanically activated device is directed instead to modifying the heat sink area and/or producing interference on the natural convective flow over the heat sink. One such arrangement is shown in FIG. 4, where the heat spreader 10, is assembled with a plurality of flow control devices 23. In this particular example, the thermo-mechanically activated means 13, is made from at least two materials with different TCE, where the material with high TCE flap 12, is placed near the heat spreader 10, and the material with lower TCE flap 14, is at the other side of the bi-material device 13. In this particular case, the flow control device 13, is expected to be flat at room temperature and bend upwards when the temperature of the heat spreader 10, increases, consequently increasing the heat exchange area and heat dissipating rate of the assembly. Similarly, many other mechanical arrangements can be devised to provide the particular thermal control function described here to modulate natural convection cooling without deviating from the principles of this invention. The flaps 12 and 14, have been shown to be of the same size, however for some applications the flap 12 could be longer than flap 14, and for others the flap 12, could be shorter than the flap 14. Similarly, the width and/or thickness of the flaps 12 and 14, could be the same or it could be different.

Figure 5:
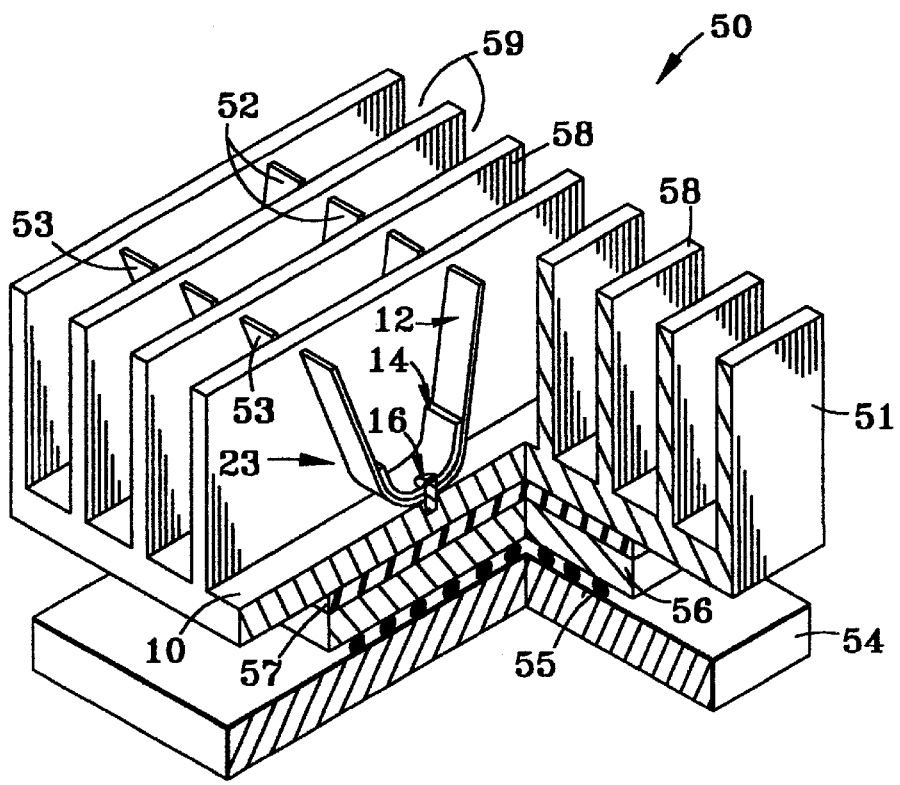
FIG. 5, is an isometric view illustrating the internal detail of an electronic assembly including a first level package, integrated circuit, and a heat sink which incorporates a thermo-mechanical device to change the assembly cooling capability in accordance with the teachings of the invention.

Fluid cooled module 50, such as, an air cooled module 50, as shown in FIG. 5, is used here to further illustrate the salient features of the present invention. This assembly 50, includes the following main components: a first level electronic package or substrate 54, an integrated circuit chip 56, a thermal exchange device or heat sink 51, having at least one flow control device 23. The integrated circuit chip 56, is electrically attached to the first level package 54, with the use of solder balls 55, and thermally attached to the heat sink 51, with at least one thermal interface or media 57, such as, a thermal grease 57. The heat sink 51, shown in FIG. 5, also includes a heat spreading base 10, with cooling fins 58. The cooling fins 58, define cooling fluid channels or passages 59.

In the particular embodiment of this invention shown in FIG. 5, each cooling channel 59, could have at least one flow control device 23, 52 and 53, which is used to modulate the air velocity distribution in each cooling channel 59. The flow control device 23, 52 and 53, could have customized flow control flaps working in harmony or independently from each other.

The flow control device 23, shown in FIG. 5, is fastened to the heat spreading base 10, by at least one securing device 16, such as, a screw 16. For this application the first plate or flap 12, has a lower TCE than the second plate or flap 14, and is also longer. The initial shape of the flow control device 23, is directly dependent on the operating temperature of the cooling fluid used to cool the assembly and the expected operating temperature of the chip when dissipating maximum power. In the particular case of an air cooled device with an expected operating temperature of about 75° C., the flow control device 23, shown in FIG. 5, has the expected shape when the assembly is at room temperature, mainly to block air flow through the heat sink 51, and cooling channels 59. By blocking the flow at low temperatures, the flow control device 23, effectively decreases the heat dissipation capability of the heat sink 50, and increases the operating temperature of the integrated circuit chip 56, when running at low power dissipation rates. Then, as the temperature of the assembly increases, the bimetallic strip 23, 52 and 53, is expected to become flat and allow air flow through the cooling channels 59, of the heat sink 51, when the temperature reaches approximately 70° C., for the bimetallic strip 23, 52 and 53.

The use of a thermally-activated flow control device 23, 52 and 53, as shown in FIG. 5, allows then the control of the assembly operating point when the chip 56, is on stand-by and dissipating a low power level such as the operating power. The increase in operating temperature, i.e., when the chip 56, uses power management will reduce the assembly fatigue caused by power-on thermal cycles. In this case, the reduction in power-on thermal cycles will be approximately proportional, depending on the flow control device 23, design used by the heat sink 51. The design and use of a flow control device 23, in a heat sink 51, becomes then an important design factor when estimating the useful life of the assembly.

Both flow control device 23, structure and operating function described have been selected for the sole purpose of illustrate the functionality of the present invention, but it is understood that the same behavior can be achieved with many alternative structures and operating functions without departing from the teachings of this invention. For example, the flow control device 23, can be built from only one material 12, instead of using a bimetallic strip structure 13. Similarly, the material selected for the component 13, could have different TCE than the material used to build the heat spreading base 10. The flow blockage can be accomplished by using the flow control device thermal induced movement to mechanically move a flow controlling flap. Also, it is possible to control the flow in all cooling channels 59, with only one flow control device 23, if all the channels have mechanically interconnected flow controlling flaps. Alternatively, the use of multiple flow control devices 23, in each channel 59, can easily increase the flow blockage efficiency. Similarly, the use of a plate (not shown) to cover the heat sink open area, thus increasing the cooling channel definition, can also increase the effectiveness of the flow control device 23, to block or enhance air flow. The flow control device 23, as shown in FIG. 5, consist of two basic units, namely, the first or upstream/downstream flap 52, and the second or downstream/upstream flap 53. Clearly, only one of the two basic units is the minimum structure required to provide the flow control function described in this invention. However, a single flap or a half-flap may provide a lower flow blockage efficiency.

A further advantage of using heat sinks with flow control devices 23, as shown in FIG. 5, is its capability to modulate the power dissipation rate of a heat sink locally, and have high dissipation rate on one side of the heat sink where more energy is being dissipated, while providing lower power dissipation capability on the other side of the heat sink where the heat dissipating device requires lower power consumption to operate, i.e., the thermal exchanger 23, 52 and 53, can work in harmony with each other or independently. This capability, shown in the heat sink and flow control device of FIG. 5, is available to the heat sink 51, when multiple and independent flow control devices 23, are placed on the heat sink to control the local cooling flow distribution. For example, the cooling flow going into a first cooling channel 59, is modulated by the first flow control device flaps 52 and 53, while the cooling flow going into the second cooling channel 59, is modulated by the second flow control device flaps 52 and 53. If the flow control device in any of the cooling channels 59, is mechanically uncoupled with the flow control device 23, in other cooling channel 59, then each flow control device 23, will respond independently to the local flow control device temperature, which in this case is determined by the heat sink/spreader temperature distribution. In this case, the heat sink of FIG. 5, will react by changing its local cooling capability in each cooling channel and try to equalize the heat sink spreader temperature distribution. This thermal characteristic can become a critical need when the heat dissipating device has a severe non-uniform power dissipation distribution.

Figure 6:
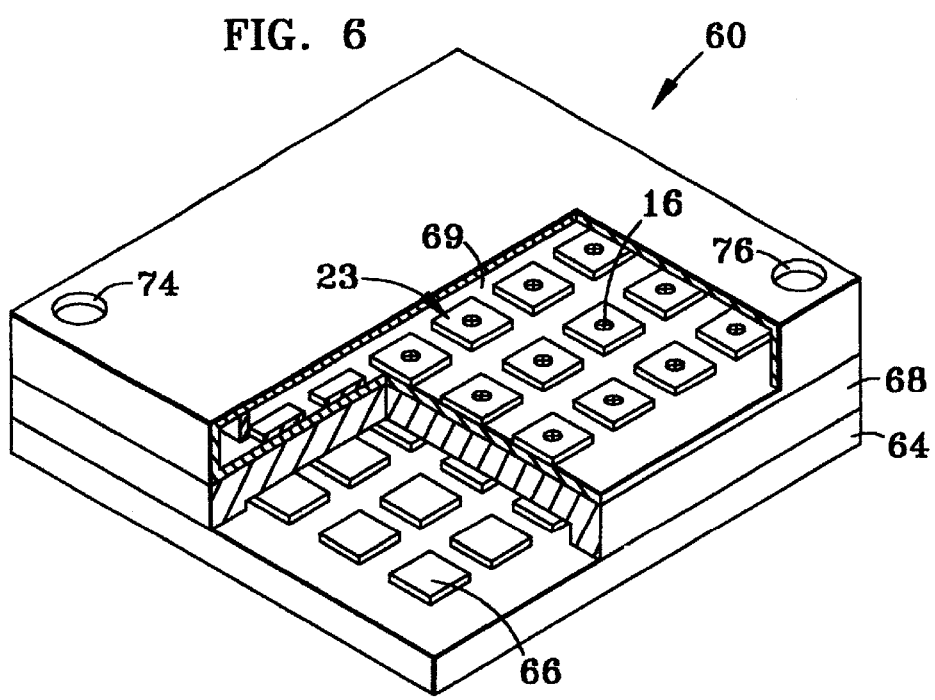
FIG. 6, is an isometric view illustrating the internal detail of an electronic multi-chip module which includes a heat sink with thermo-mechanical means to change the cooling characteristics of the module in accordance with the teachings of the invention.

A particular application of the advantageous capability of a heat sink with flow control devices to modulate its local heat dissipation rate is shown in FIG. 6, which shows the use of this technology for the cooling of a multi-chip module (MCM). Here, a fluid cooled module 60, having multi-chip module 64, contains at least one heat dissipating chip 66, is cooled with a heat spreader 68, such as, a cold plate 68. Typically, the cold plate 68, is cooled with a fluid, such as, water, antifreeze, to name a few, which flows into the cold plate 68, through flow inlet/outlet 74, and flow outlet/inlet 76, into at least one fluid chamber 69, such as, a cooling fluid chamber 69. The internal geometry of the cold plate 68, typically is much more complex than the details given in FIG. 6, and have been simplified here for the sole purpose of describing the teachings of this invention. However, it is understood that geometric departures from FIG. 6, shown here are obvious and expected to provide the cooling function required.

The cold plate 68, as shown in FIG. 6, has been provided with at least one local flow control devices 23. It is preferred that there is at least one flow control device 23, directly above each heat dissipating chip 66. The flow control device 23, are made to have maximum gain at the expected cooling flow average operating temperature. In this particular application, the mechanical movement required to produce high heat flow control is minimal because of the high heat flux dissipating capability expected and designed into the cooling assembly and because any small local flow perturbation will have a large impact to the local thermal dissipation rate.

It should also be understood that the uses and applications of heat sinks of variable heat dissipating characteristics as described above can also be advantageously applied to the heating or cooling of non-electronic devices. The variable thermal transfer capability of this invention can also be applied to the thermal exchange between two non-contacting fluid streams with different temperatures, or for heating/cooling a chemical reactor with a heating/cooling fluid to control the temperature when the reactor process includes an endothermic reaction. In many of these applications, the use of thermo-mechanically actuated devices may be required to reduce the control dependency on active control elements of critical processes which may fail when the electric power is suddenly not available.

The use of flow control devices in a heat sink is also advantageous from thermal transient point of view. The flow control devices described above block the flow when the chip power dissipation is low or zero, hence during the assembly power-on transient the assembly power dissipation is minimal at time zero. Thus, the assembly will warm-up at its maximum temperature increase rate when the heat sink includes a high efficiency flow control device, and reach operational chip temperature 4 to 6 times faster than possible with the use of conventional heat sinks. This advantage can become critical when the heat dissipating assembly must preserve power but become active and ready in a short time, such as, those found in some mobile electronic applications.

Another, advantage of using a flow control device in a heat sink, as described in this invention, is its inherent insensitivity to change in the assembly operating temperature with changes in power dissipation level. The temperature to power sensitivity is given by the slope of operating power curve. The minimum slope is located when the power is at level. The operating curve shape is directly determined by the characteristics of the flow control device used in the given heat sink design. Therefore, by selecting an oversized heat sink for a given maximum power dissipation level it is possible to make the power level to be the maximum expected power dissipation of the heat generating device. Thus one would achieve the lowest sensitivity to power dissipation when the actual operating power deviates by a relatively small amount from the power level. Since the thermally-activated mechanical movement of a bimetallic strip is actuated relative to the absolute value of its temperature, this maximum gain point is fully defined and selected during the design and assembly of the flow control device. This flow control device temperature dependency can also be used to reduce the sensitivity between the assembly operating temperature and the temperature of the cooling fluid. This is a useful heat sink characteristic of this invention, when the fluid temperature is not well known or dependent of all other heat dissipating components located upstream of the assembly are of interest.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for regulating the temperature of an electronic component assembly, the apparatus comprising:
   a heat sink connected to the assembly, the heat sink including a base and fins perpendicular to the base, the fins defining a plurality of cooling fluid channels;
   a plurality of flow control devices in the channels, each flow control device including a strip of material extending along the channel and having two flaps and a central portion, the central portion being fastened to the base, one of said flow control devices being a variable thermal device whose flaps move in accordance with the temperature,
   wherein the flaps of the flow control devices move so as to block flow of the cooling fluid through the channels when cooling of the assembly is not required, and to permit flow of the cooling fluid through the channels when cooling of the assembly is required.

2. An apparatus according to claim 1, wherein the variable thermal device includes a bimetallic strip.

3. An apparatus according to claim 1, wherein the variable thermal device has a strip with a thermal coefficient of expansion (TCE) different from that of the base.

4. An apparatus according to claim 1, wherein the flaps of the flow control devices are substantially flat and proximate to the base when the temperature of the assembly is approximately 70° C.

5. A method of regulating the temperature of an electronic component assembly, the method comprising the steps of:
   providing a heat sink connected to the assembly, the heat sink including a base and fins perpendicular to the base, the fins defining a plurality of cooling fluid channels;
   fastening a plurality of flow control devices to the base, each flow control device including a strip of material extending along a respective channel and having two flaps and a central portion, the strip being fastened to the base at the central portion;
   providing one of said flow control devices as a variable thermal device whose flaps move in accordance with the temperature; and
   flowing the cooling fluid through the channels,
   wherein the flaps of the flow control devices move so as to block flow of the cooling fluid through the channels when cooling of the assembly is not required, and to permit flow of the cooling fluid through the channels when cooling of the assembly is required.

6. A method according to claim 5, wherein the variable thermal device is provided with a bimetallic strip.

7. A method according to claim 5, wherein the variable thermal device is provided with a strip having a thermal coefficient of expansion (TCE) different from that of the base.

8. A method according to claim 5, wherein the flaps of the flow control devices are substantially flat and proximate to the base when the temperature of the assembly is approximately 70° C.

* * * * *